US 12,431,291 B2

(12) United States Patent
Voiron et al.

(10) Patent No.: US 12,431,291 B2
(45) Date of Patent: Sep. 30, 2025

(54) CAPACITOR STRUCTURE WITH VIA EMBEDDED IN POROUS MEDIUM

(71) Applicant: Murata Manufacturing Co., Ltd., Nagaokakyo (JP)

(72) Inventors: Frédéric Voiron, Barraux (FR); Brigitte Soulier, Grenoble (FR); Julien El Sabahy, Grenoble (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 291 days.

(21) Appl. No.: 18/328,059

(22) Filed: Jun. 2, 2023

(65) Prior Publication Data
US 2023/0307185 A1    Sep. 28, 2023

Related U.S. Application Data

(63) Continuation of application No. PCT/IB2021/060801, filed on Nov. 22, 2021.

(30) Foreign Application Priority Data

Dec. 2, 2020   (EP) .................................... 20306479

(51) Int. Cl.
*H01G 4/228* (2006.01)
*H01G 4/33* (2006.01)
(52) U.S. Cl.
CPC ............... *H01G 4/228* (2013.01); *H01G 4/33* (2013.01)
(58) Field of Classification Search
None
See application file for complete search history.

(56) References Cited

U.S. PATENT DOCUMENTS

| | | | |
|---|---|---|---|
| 8,385,046 B2 * | 2/2013 | Palusinski | H01G 4/06 361/311 |
| 9,991,333 B1 | 6/2018 | Liu et al. | |
| 2004/0147087 A1 | 7/2004 | Cheng et al. | |
| 2010/0252527 A1 * | 10/2010 | Takeshima | H10D 1/716 216/13 |
| 2011/0013340 A1 | 1/2011 | Horiuchi et al. | |
| 2013/0329337 A1 | 12/2013 | Masuda et al. | |

(Continued)

FOREIGN PATENT DOCUMENTS

| | | |
|---|---|---|
| EP | 3043381 A1 | 7/2016 |
| EP | 3680931 A1 | 7/2020 |
| WO | 2015063420 A1 | 5/2015 |

OTHER PUBLICATIONS

International Search Report issued for PCT/IB2021/060801, date of mailing Nov. 22, 2021.

(Continued)

*Primary Examiner* — Eric W Thomas
(74) *Attorney, Agent, or Firm* — ArentFox Schiff LLP

(57) ABSTRACT

A capacitor structure that includes a substrate; a conductive layer above the substrate; and a porous layer, above the conductive layer, having pores that extend perpendicularly from a top surface of the porous layer toward the conductive layer. The porous layer comprises a first region in which pores conductive wires are disposed, and a second region in which pores a metal-insulator-metal (MIM) structure is disposed. The first region may be used as a via to contact a bottom electrode of the capacitor structure.

13 Claims, 13 Drawing Sheets

(56) References Cited

U.S. PATENT DOCUMENTS

2016/0268144 A1    9/2016  Voiron et al.
2017/0316881 A1   11/2017  Bachman et al.
2021/0226000 A1*   7/2021  Nishita .................. H10D 1/692

OTHER PUBLICATIONS

Hong, Chitsung et al.; "Implementation of a New Capacitive Touch Sensor Using the Nanoporous Anodic Aluminum Oxide (np-AAO) Structure"; IEEE Sensors Journal, vol. 11, No. 12, Dec. 2011.
Hong, Chi-Tsung et al.; "Nanotexture Electrode on Nanoporous AAO Dielectric for Micro Tactile Sensing Devices"; Micro Electro Mechanical Systems, 2009, IEEE 22nd International Conference on Jan. 1, 2009, pp. 100-103.
Banerjee, P. et al.; "Nanotubular metal-insulator-metal capacitor arrays for energy storage"; Nature Nanotechnology, vol. 4, May 2009, pp. 292-296.

\* cited by examiner

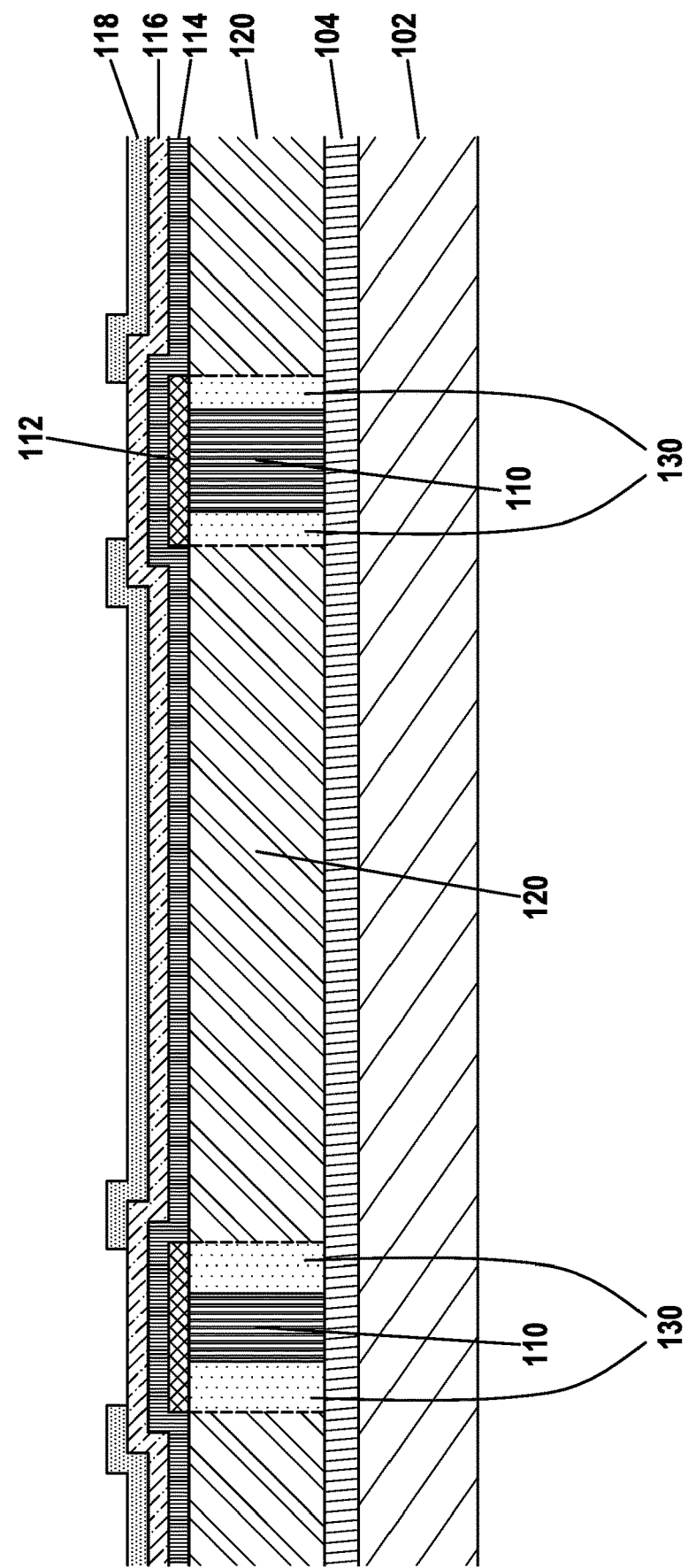

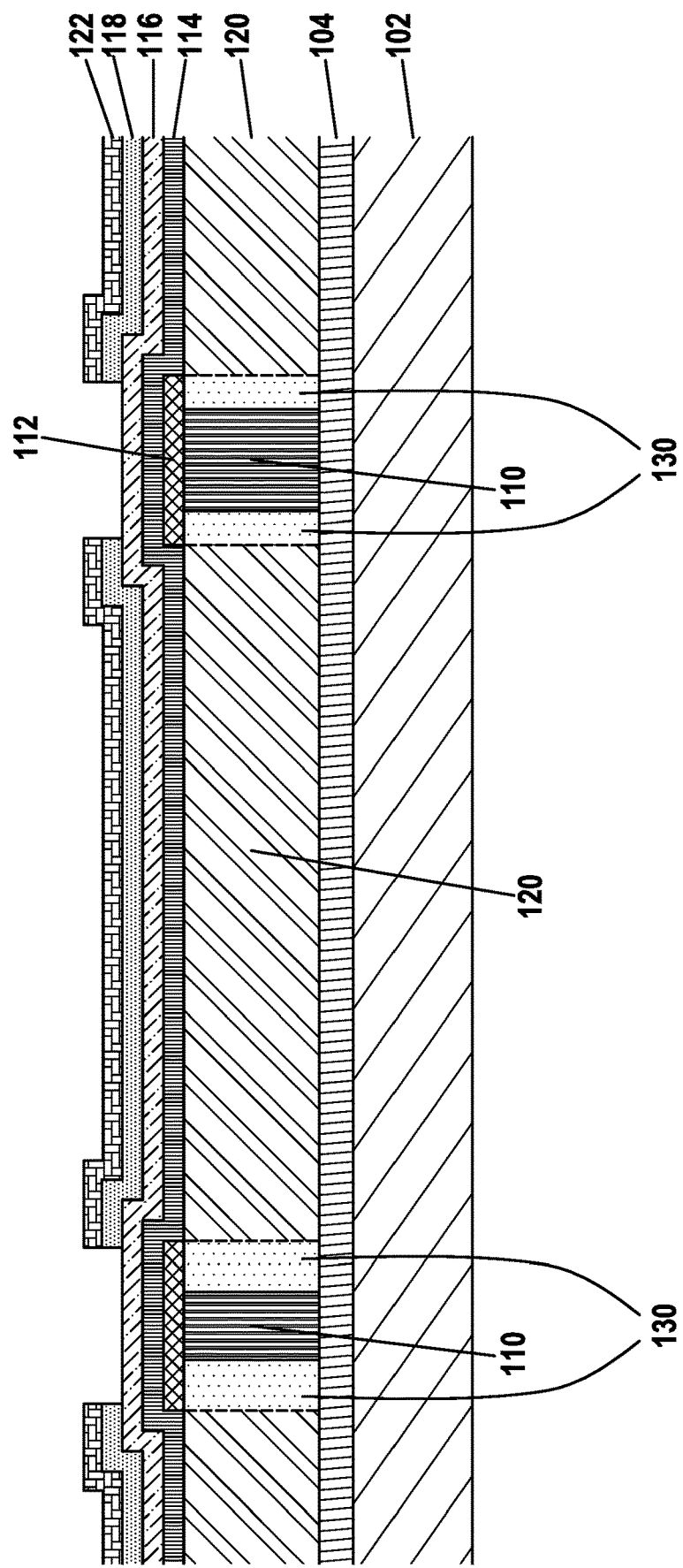

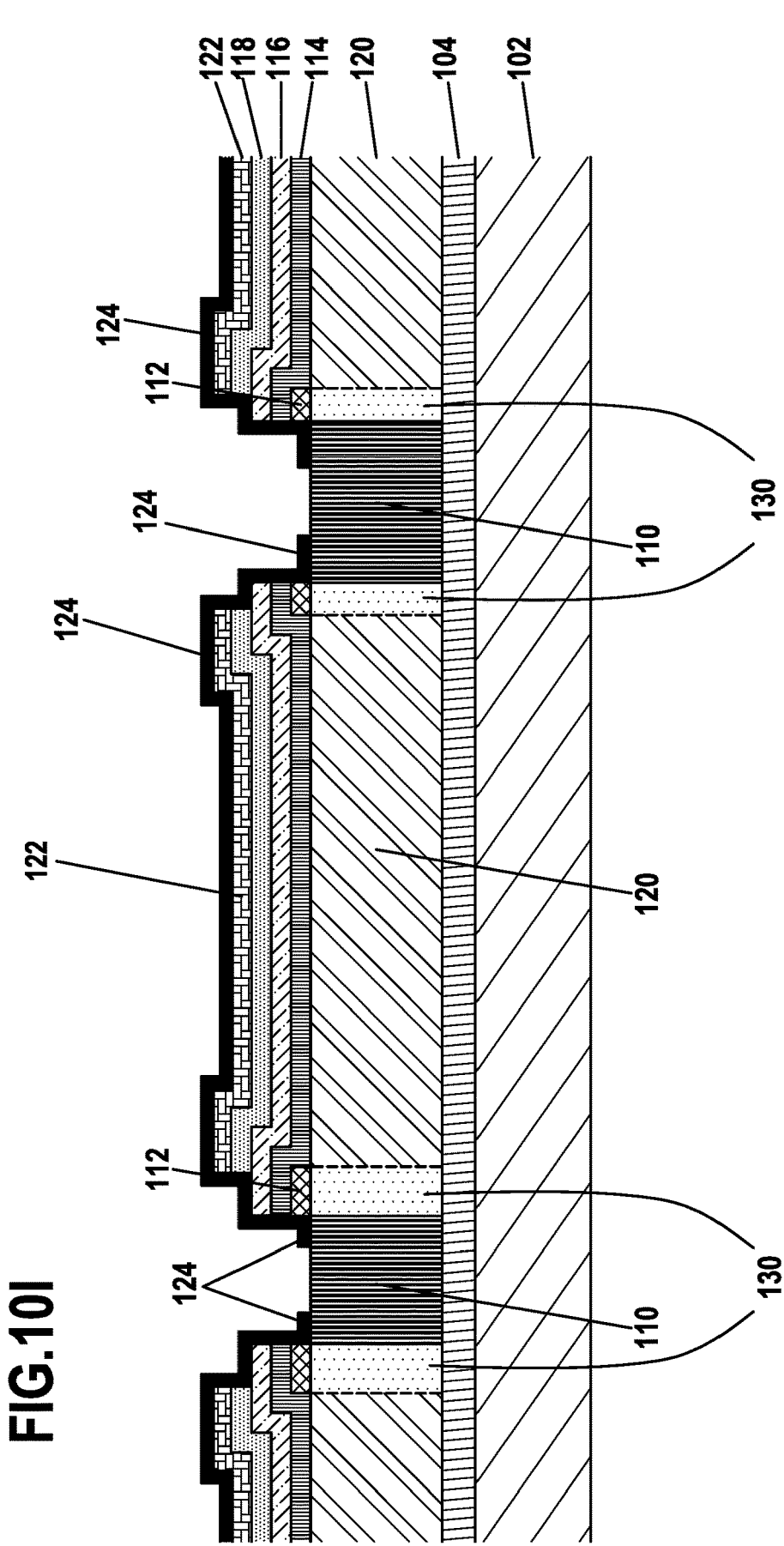

CAPACITOR STRUCTURE WITH VIA EMBEDDED IN POROUS MEDIUM

CROSS REFERENCE TO RELATED APPLICATIONS

The present application is a continuation of International application No. PCT/IB2021/060801, filed Nov. 22, 2021, which claims priority to European Patent Application No. 20306479.5, filed Dec. 2, 2020, the entire contents of each of which are incorporated herein by reference.

FIELD OF THE INVENTION

The present invention relates to the field of integration and, more particularly, to electronic products, related semiconductor products, and their methods of manufacture.

TECHNICAL BACKGROUND

Silicon passive integration technologies are nowadays accessible for industrial design. For example, the PICS technology developed by Murata Integrated Passive Solutions allows integrating high density capacitive components into a silicon substrate. According to this technology, tens or even hundreds of passive components can be efficiently integrated into a silicon die.

In their work titled "Nanotubular metal-insulator-metal capacitor arrays for energy storage" (published in Natural technology, May 2009), P. Banerjee et al. describe a metal-insulator-metal (MIM) structure formed in a porous anodic material, such as porous anodic alumina (PAA) for example. The successive layers of metal, insulator, and then metal follow the contours of the porous material resulting in the MIM structure being embedded inside the pores of the porous material. Banerjee's PAA embedded structure however suffers from high Equivalent Series Resistance (ESR) and limited capacitance density due to the PAA thickness that can be deposited by Atomic Layer Deposition (ALD).

A structure by F. Voiron et al. that improves Banerjee's ESR and capacitance is described in international application publication WO 2015/063420 A1. Voiron's structure results in highly integrated capacitance that may be used in a variety of applications. In this structure the bottoms of the pores are opened and the lower metal layer of the MIM structure contacts a conductive layer that underlies the porous region, providing electrical contact and reducing ESR.

Generally, PAA embedded structures as described above result from embedding a structure (e.g., a MIM capacitive stack) inside a porous region above a substrate, such as a silicon wafer. Typically, the porous region results from anodizing a layer of metal, such as aluminum, deposited above the substrate. The anodization converts the aluminum layer into porous anodic alumina. Typically, the porous region is formed with any shape (as viewed from the top) and extends across the alumina layer in a direction perpendicular to the wafer surface.

FIG. 1 illustrates in a cross-section view a conventional layout 100 for embedding a capacitor structure into a porous region. The underlying structure may include a substrate 102, a conductive layer 104 above the substrate 104, and a metal layer 106 above the conductive layer 104.

According to the conventional layout 100, the metal layer 106 is anodized in defined regions 106b, leaving regions 106a non-anodized. Typically, this is done by applying a hard mask layer (not shown) on top of metal layer 106 to mask the areas corresponding to regions 106a. The masking shields these areas from contact with the anodization electrolyte. The porous region is thus formed in the regions 106b where the hard mask layer is open. Capacitive structures are then embedded into one or more the regions 106b as desired.

In practice, however, the effective structure resulting the conventional layout of FIG. 1 is different. Indeed, as shown in FIG. 2, and in more detail in FIG. 3, each of regions 106b in fact consists of a region 106c and of two lateral regions 106d.

The region 106c corresponds to a region in which the pores are well-formed, i.e., they are substantially uniform and extend all the way down to the conductive layer 104. In practice, some of the pores of region 106c may need to be etched at the bottom to ensure they are fully open, but generally these pores are adequate to have a MIM stack deposed into them.

In contrast, the regions 106d correspond to regions in which the pores are malformed with high probability and, as such, are inadequate for receiving the MIM stack.

The pore malformation in regions 106d is due to these regions being adjacent to the interfaces between each region 106 and its surrounding regions 106a. In fact, as mentioned above, during anodization, a hard mask is formed over the defined regions 106a to shield them from anodization. The proximity of regions 106d to this hard mask leads to a gradually decreasing anodization electric field in these regions. The closer to the hard mask edge, the weaker the anodization electric field is and the lower the pore formation is.

The effect of this phenomenon is that the pores in regions 106d stop in a residual aluminum ledge 302, rather than extending all the way down to the conductive layer 104. The fact that the pores in regions 106d end in ledge 302 is another reason for them being inadequate for receiving the MIM stack. In practice, MIM deposition, and particularly deposition of the conductive M layers, is done using thermal Atomic Layer Deposition (ALD). Precursors for such conductive layer deposition (e.g., for conductive materials like TiN, MoN, WN, etc.) are chlorine-based and induce corrosion into aluminum.

In practice, the width of the regions 106d is correlated to the thickness of the metal layer 106 being anodized (the thicker the metal layer, the wider the regions 106d). Approximately, the width of the region 106d is 3 times the thickness of the metal layer 106.

The width of ledge 302 (and of regions 106d) may be reduced by additional control of the anodization process. For example, the process may be allowed to continue a longer time. However, this comes at the risk of weakening the interface between layers 104 and 106, leading to delamination of portions of layer 106. In particular, as the anodization process is allowed to run for a longer time, it becomes difficult to control the oxidization of the layer 104, and particularly to constrain oxidization of the layer 104 in the horizontal direction in between the pores. When the pores are subsequently etched (during a step of opening the bottoms of the pores), the interface between layers 104 and 106 becomes weak causing layer 106 to delaminate.

In implementation, some of regions 106a may be provided in structure 100 in order to form electrical vias to contact, from the top, the bottom electrodes of the capacitive structures embedded into regions 106b. Additionally, some of the regions 106a may be provided at the edges of the wafer in proximity to the dicing lanes, areas of the wafer in which no capacitive structures are built.

It is usually desirable to provide contact redundancy by providing several vias to contact a given bottom electrode. In addition, in some cases, the addition of electrical vias may be needed to improve electrical performance. For example, it is desired to reduce the Equivalent Series Resistance (ESR) and the Equivalent Series Inductance (ESL) of the capacitor structure. The addition of electrical vias can help reduce both ESR and ESL. This is particularly true for smaller size capacitors (e.g., below ¼ mm$^2$) where capacitance parallelization is lower than for greater size capacitor structures.

The presence of ledge 302 (and of regions 106d) however is problematic when a large number of electrical vias are needed in the capacitor structure. Indeed, as shown in FIG. 4, whenever a region 106a of effective width d1 is present between two porous regions 106b, a width d2, much greater than d1, is needed as regions 106d are lost. In practice, the inventors of the present invention have observed that implementing an electric via of effective width d1 of 15 microns may require up to 100 microns of lateral footprint, as the regions 106d may each be up to 30 microns (and with process overlay rules requiring further spacing).

FIG. 5 is a top view 500 illustrating the effective capacitance area resulting from the conventional structure 100 of FIG. 1. In particular, the area 502 corresponds to the wafer area in which a capacitance structure is built. Area 502 may correspond to the regions 106c described above. Conversely, areas 504 are wafer areas that are not used for capacitance structures. Areas 504 may correspond to the regions 106a and 106d described above. The area 506 corresponds to the dicing area of the wafer.

As shown in FIG. 5, the effective capacitance area is much lower than the total area of the wafer according to conventional structure 100. This is further shown in FIG. 6, which illustrates the ratio of the effective capacitance area to the total area as a function of capacitor surface area according to an example implementation. The example implementation assumes an effective via width (d1) of 15 microns and a width of 30 microns for each of regions 106d.

As shown, the ratio of effective/total area is below 80% for capacitors smaller than 0.25 mm$^2$. The ratio decreases to below 70% for capacitors under 0.1 mm$^2$ and to below 50% for capacitors under 0.04 mm$^2$.

The present invention has been made in the light of the above problems.

SUMMARY OF THE INVENTION

The present invention provides a capacitor structure, comprising: a substrate; a conductive layer above the substrate; and a porous layer, above the conductive layer, having pores that extend perpendicularly from a top surface of the porous layer toward the conductive layer, wherein the porous layer comprises a first region in which pores conductive wires are disposed, and a second region in which pores a metal-insulator-metal (MIM) structure is disposed.

The conductive wires form a via through the capacitor structure. As such, the capacitor structure comprises, in the porous layer, both a region for forming a capacitance and a region for providing a via through the capacitor structure.

The via may be used to contact the conductive layer, which may serve as a bottom of electrode of the capacitor structure.

The fact that both the MIM structure and the via are provided in the same porous layer reduces the lateral footprint of the via within the capacitor structure. As such, the effective utilization of the porous layer as well as the effective capacitance area within the capacitor structure are increased.

In addition, as transitions from porous to non-porous regions (e.g., non-anodized metal) within the capacitor structure are reduced, porous regions with residual underlying metal are reduced. As such porous regions may be prone to corrosion, their reduction improves the reliability of the capacitor structure.

In an embodiment, the porous layer comprises a third region which pores are empty, the third region separating the first region and the second region. The third region may help keep the MIM structure electrically isolated from the conductive wires. The third region with its empty pores may also reduce mechanical stress within the capacitor structure.

The third region may be immediately adjacent to the first region and immediately adjacent to the second region. The third region may thus help satisfy overlay fabrication rules.

In an embodiment, the bottom ends of the pores of the porous layer open onto the conductive layer. This allows for contact between components embedded into the pores and the conductive layer underlying the porous layer.

In an embodiment, the MIM structure disposed in the pores of the second region comprises a first metal layer, disposed conformally into the second region, an insulator layer disposed conformally over the first metal layer, and a second metal layer disposed conformally over the insulator layer. The first metal layer contacts the conductive layer at the bottom of each pore of the second region In an embodiment, the bottom ends of the conductive wires contact the conductive layer at the bottom of the pores of the first region. The conductive layer may form the bottom electrode of the capacitor structure. As such, the conductive wires form a via through the capacitor structure for contacting the bottom electrode of the capacitor structure.

In an embodiment, the conductive layer comprises a first layer and a second layer, the second layer disposed between the first layer and the porous layer.

In an embodiment, the first layer is made of aluminum, though other metals may be used.

In an embodiment, the second layer is made of tungsten or titanium. In an embodiment, the second layer serves as an etch barrier layer for protecting the first layer during formation by anodization of the porous layer. This ensures that the first layer is not anodized, ensuring it retains a high conductivity.

In an embodiment, the second layer is discontinuous and open under the first region and/or the second region of the porous layer. The opening of the second layer under the first region and/or the second region may be performed to ensure direct contact between the first metal layer of the MIM structure and the conductive layer and/or between the conductive wires and the conductive layer.

In an embodiment, the porous layer is made of anodic aluminum oxide (AAO).

In an embodiment, the substrate may be made of silicon, glass, or a polymer.

In another embodiment, the substrate may be made of silicon and may have a field oxide layer between itself and the conductive layer. The conductive layer maybe a composite layer of an aluminum or copper layer and a barrier layer like titanium or tungsten.

In an embodiment, the capacitor structure comprises a metal layer, above the conductive layer, surrounding the porous layer from the sides. The metal layer may be a remnant of the initial metal layer that is anodized to form the porous layer. The metal layer may surround the edges of the porous layer.

In another embodiment, the metal layer may further comprise islands inside the porous layer. The number and position of the metal islands may be chosen by design before anodization to form the porous layer. Specifically, the metal islands are selected to ensure an anodization that is as uniform as possible.

In an embodiment, the capacitor structure comprises: a first conductive layer in contact with the MIM structure; and a second conductive layer, isolated from the first conductive layer, in contact with the top ends of the conductive wires.

The first conductive layer may serve as a top electrode of the capacitor structure. The second conductive layer may serve as a contact to the bottom electrode of the capacitor structure.

In another aspect, the present invention also provides a method of fabricating a capacitor structure, comprising: forming a porous layer above a conductive layer, the porous layer having pores that extend perpendicularly from a top surface of the porous layer toward the conductive layer; forming conductive wires in the pores of a first region of the porous layer, the bottom ends of the conductive wires contacting the conductive layer at the bottoms of the pores of the first region; forming a metal-insulator-metal (MIM) structure in the pores of a second region of the porous layer.

In an embodiment, forming the conductive wires in the pores of the first region comprises: depositing a first hard mask over the porous layer, the first hard mask being open over the first region; and growing the conductive wires in the pores of the first region by electro-chemical deposition (ECD).

In an embodiment, the conductive wires may be made of nickel or copper.

In an embodiment, forming the MIM structure in the pores of the second region comprises: removing the first hard mask; depositing a second hard mask covering the first region and an adjacent third region (130) of the porous layer; and depositing the MIM structure into the porous layer and the second hard mask.

In an embodiment, the method also comprises: forming a first conductive layer over the MIM structure; etching the MIM structure and the second hard mask over at least a section of the first region to expose the top ends of at least some of the conductive wires; forming an insulation layer over the first conductive layer, the insulator layer fully covering the first conductive layer; and forming a second conductive layer over the top-end exposed conductive wires and at least a portion of the insulation layer, the second conductive layer in contact with the top ends of the at least some of the conductive wires.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 10A-10K illustrate a process for producing a capacitor structure in accordance with the proposed layout, according to an embodiment;

DETAILED DESCRIPTION OF EXAMPLE EMBODIMENTS

Figure 7A:
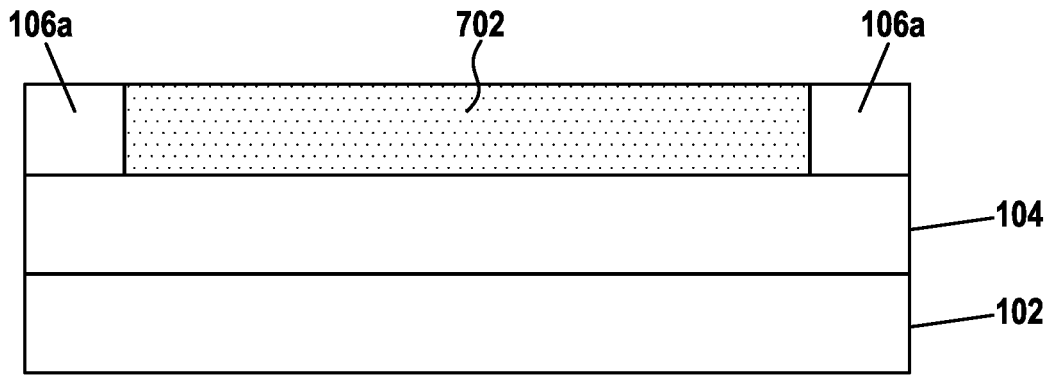
FIGS. 7A-7C illustrate in a cross-section view a proposed layout for embedding a capacitor structure into a porous template according to an embodiment.

FIG. 7A illustrates in a cross-section view a proposed layout 700 for embedding a capacitor structure into a porous region according to an embodiment. As above, the underlying structure is assumed to include a substrate 102, a conductive layer 104 above the substrate 102, and a metal layer 106 above the conductive layer 104.

As shown in FIG. 7A, rather than defining, within the metal layer 106, interleaving anodized and non-anodized regions, the metal layer 106 may be anodized to form a continuous porous layer 702.

In an embodiment, the continuous porous layer 702 may be designed to extend over the entirety of the wafer surface. For example, in one implementation, a wafer-level anodization may be used to obtain the porous layer 702. Such an embodiment may be suitable in the case that a uniform anodization across the wafer can be ensured. This can be done by selecting the layer 104 such that it enables a uniform charge distribution across the wafer. In an example experiment, uniform charge distribution across the wafer was obtained using a layer of tungsten of 300 nm as the layer 104.

In another embodiment, as shown in FIG. 7A, certain regions 106a of the metal layer 106 may be left non-anodized. Regions 106a may be located at the edges of the die and/or in the dicing street (beyond the edge of the die or at the edge of the wafer).

In another environment, the metal layer 106 may be left non-anodized in a few islands within the porous layer 702. The non-anodized metal islands may be in the form of a sparse metal grid within the porous layer 702. Such an embodiment may be suitable in the case that the die is isolated (e.g. by a field oxide) from the wafer backside. The non-anodized metal islands help ensure that the anodic voltage is provided in a uniform manner across the wafer.

Figure 7B:
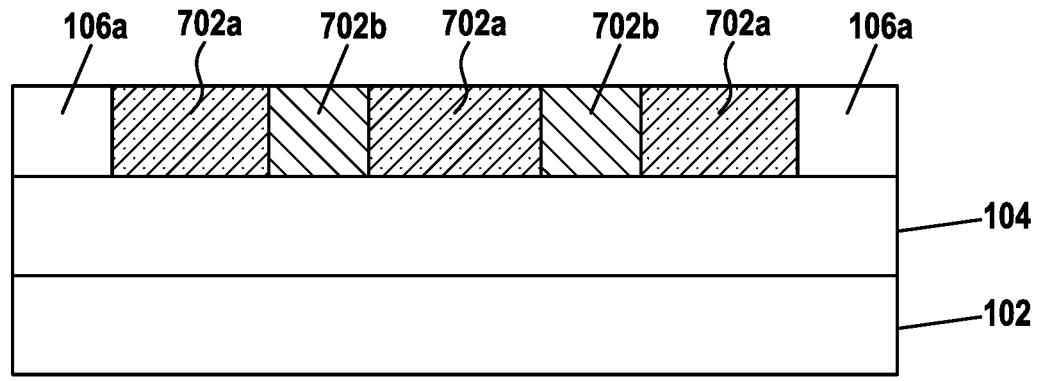

As shown in FIG. 7B, the porous layer 702 is then partitioned between regions 702a designed for receiving capacitive structures, and regions 702b designed for serving as electrical vias in the capacitor structure. In the regions 702a, a MIM stack may be deposited into the pores. In the regions 702b, conductive wires may be formed in the pores to provide the electrical vias vertically through the structure. In an embodiment, the conductive wires may be grown using electrochemical deposition (ECD) inside the pores of the regions 702b.

By using the layout 700, the effective utilization of the wafer area is increased substantially. Indeed, as a porous to non-porous transition is no longer needed to implement an electrical via, the via can now be placed much closer to an adjacent functional MIM structure. As such, the lateral footprint of a via can be reduced significantly.

Figure 7C:
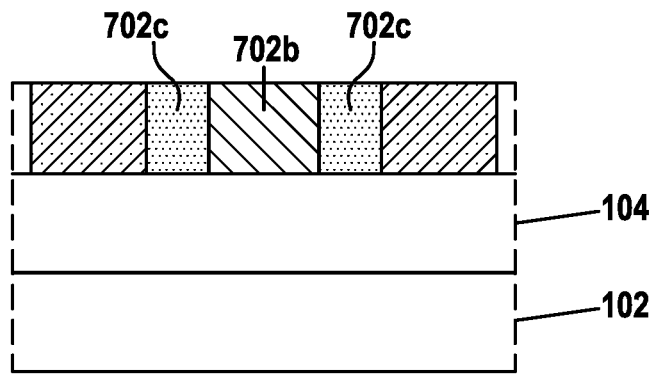

In practice, some isolation may be needed between regions 702a and 702b, for example due to process overlay rules. In an embodiment, as shown in FIG. 7C, when a region 702a is adjacent to a region 702b in which a via is to be built, a small portion 702c of region 702a (e.g., 5-10 microns) may be designated as an isolation region. In the isolation region, neither a MIM structure nor conductive wires are built. In an embodiment, the pores of the region 702c may be left empty.

However, the lateral footprint of a via remains very small. In experiments, the inventors have observed that an electric via with an effective width of 15 microns may require a lateral footprint of only 27 microns. This may be reduced further with better photolithographic alignment.

As mentioned above, electrical vias may be needed in great numbers in the capacitor structure to provide contact redundancy and/or for ESR/ESL control. By substantially reducing the lateral footprint of a via, the proposed layout can thus have a substantial impact on the effective capacitance resulting from the structure.

Figure 8:
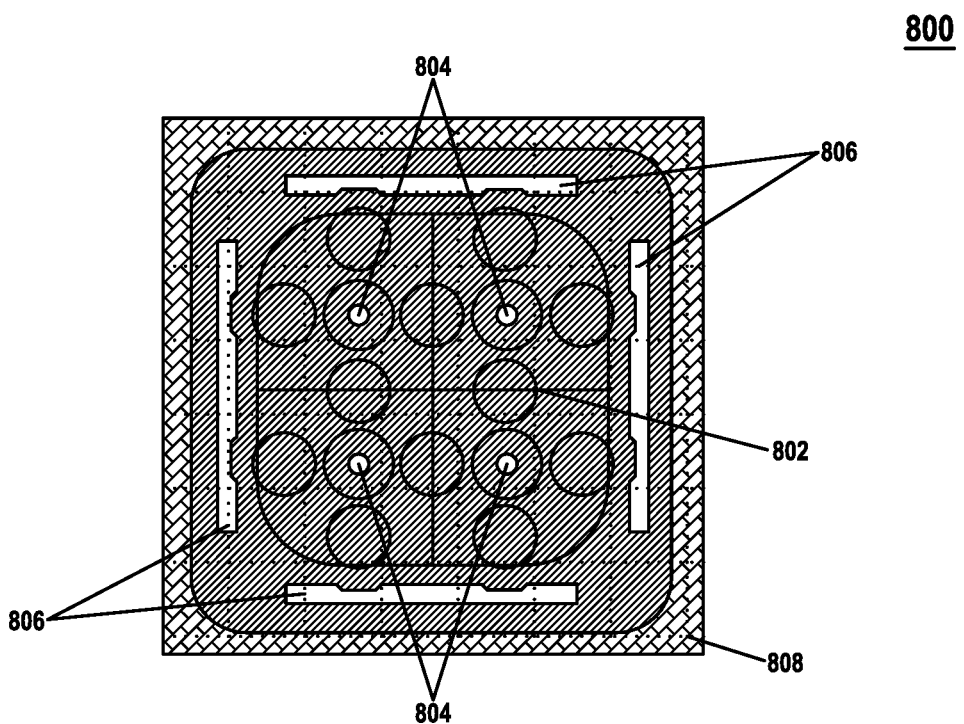
FIG. 8 illustrates the effective capacitance area resulting from the proposed layout according to an environment.

FIG. 8 is a top view 800 illustrating the effective capacitance area resulting from the proposed layout according to an embodiment. In particular, the area 802 corresponds to the wafer area in which a capacitance structure is built. Area 802 may correspond to the regions 702a shown in FIG. 7B be above. Conversely, areas 804 are wafer areas in which vias are built. Areas 804 may correspond to regions 702b illustrated in FIG. 7B above. In another embodiment, areas 804 may correspond to regions 702b and 702c as shown in FIG. 7c illustrated in FIG. 7C above. The area 808 corresponds to the dicing area of the wafer.

Optionally, areas 806 corresponding to regions of non-anodized metal may be provided. As mentioned above, these regions may be provided for the purpose of enhancing the anodization process across the wafer. Alternatively, areas 806 may correspond to wafer areas in which vias are built, similar to areas 804.

Figure 1:
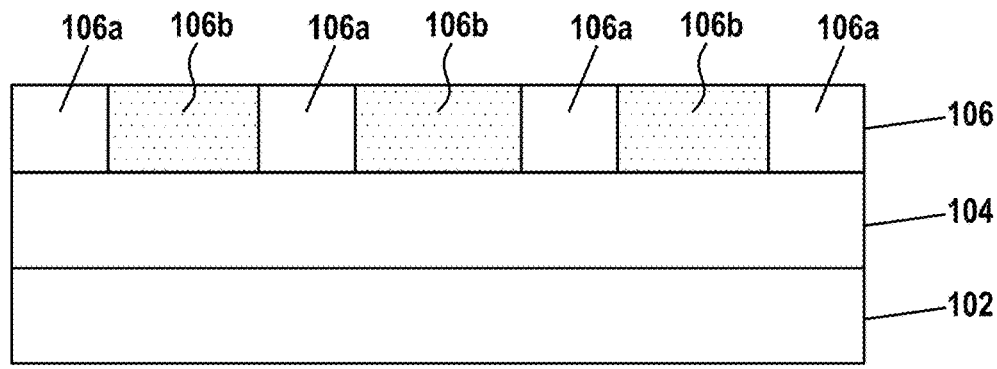
FIG. 1 illustrates in a cross-section view a conventional layout for embedding a capacitor structure into a porous template.
Figure 2:
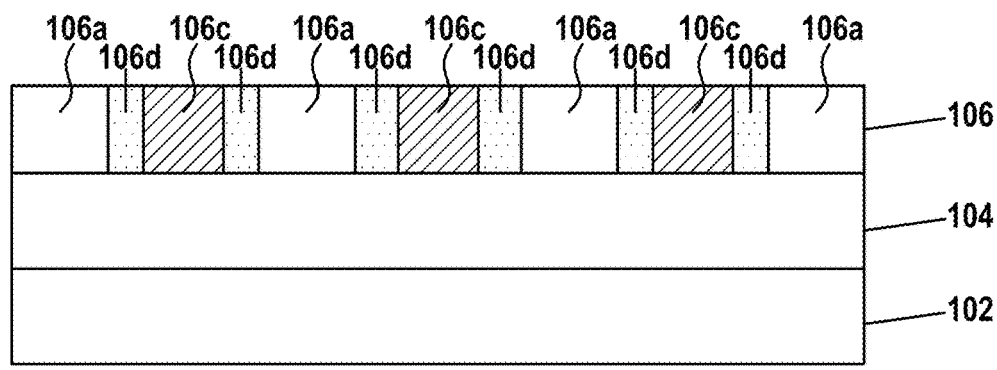
FIG. 2 illustrates in a cross-section view the effective structure resulting from the conventional structure of FIG. 1.
Figure 3:
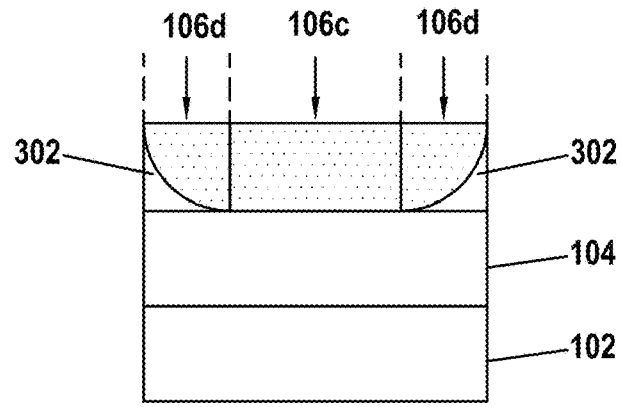
FIG. 3 shows an enlarged view of a section of the effective structure of FIG. 2.
Figure 4:
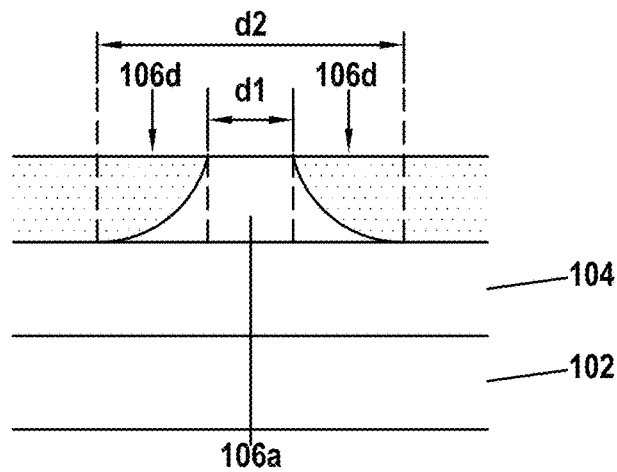
FIG. 4 shows in a cross-section view a via formed in the effective structure of FIG. 2.
Figure 5:
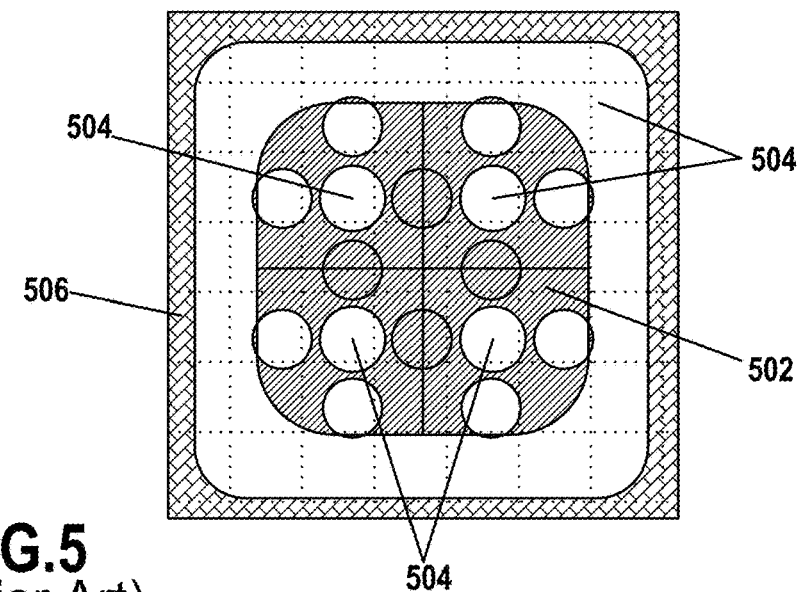
FIG. 5 is a top view illustrates the effective capacitance area resulting from the conventional structure of FIG. 1.
Figure 6:
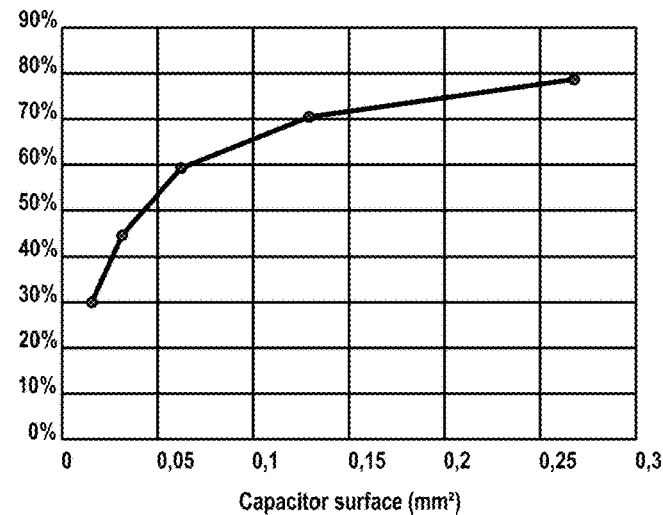
FIG. 6 illustrates the ratio of the effective capacitance area to the total area as a function of capacitor surface area for the convention structure of FIG. 1.
Figure 9:
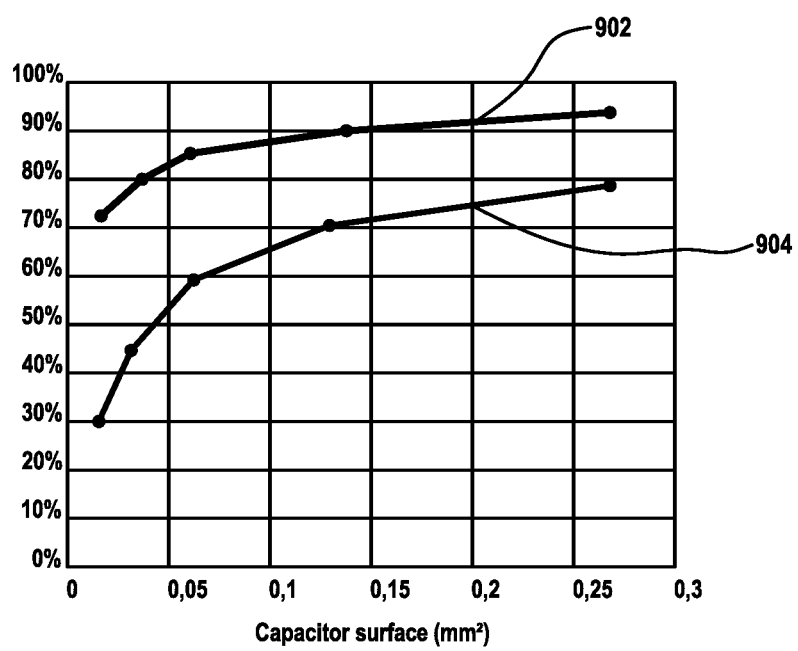
FIG. 9 illustrates the impact of the proposed layout on the ratio of net to raw capacitance.

As shown in FIG. 8, the effective capacitive area is significantly increased relative to the total area of the wafer, as compared to the conventional layout illustrated in FIG. 5. This is further illustrated in FIG. 9, which shows the ratio of the effective capacitance area to the total wafer area as a function of capacitor surface area according to an example implementation. Particularly, in FIG. 9, the line 902 corresponds to performance using the layout of the present invention, whereas the line 904 corresponds to performance using the conventional layout. As shown, the utilization ratio increases significantly for all capacitor values. For smaller structures, the increase may be as high as 100%, doubling capacitive density. This kind of improvement may also be observed in a structure with high contact redundancy.

FIGS. 10A-10K illustrate an example process for producing a capacitor structure in accordance with the proposed layout, according to an embodiment. This example process is provided for the purpose of illustration only and is not limiting of embodiments of the present invention.

Figure 10A:
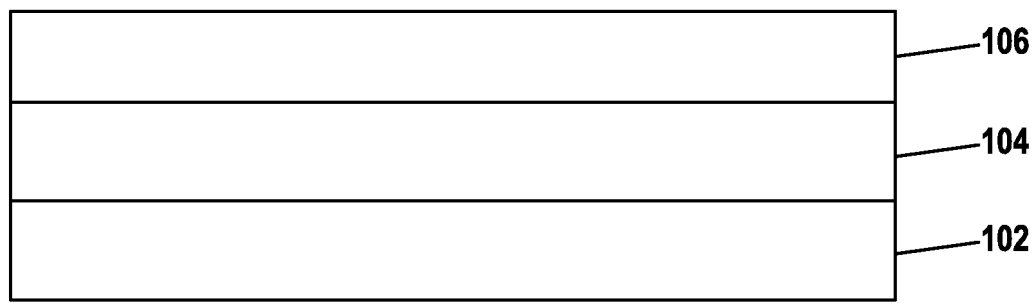

As shown in FIG. 10A, the process begins by forming a stack including a substrate 102, a conductive layer 104 above the substrate, and a metal layer 106 above the conductive layer 106.

In an embodiment, the conductive layer 104 comprises a first layer and a second layer, with the second layer disposed between the first layer and the metal layer 106. In an embodiment, the first layer is made of aluminum and the second layer is made of tungsten. The metal layer 106 may be made of aluminum.

Figure 10B:
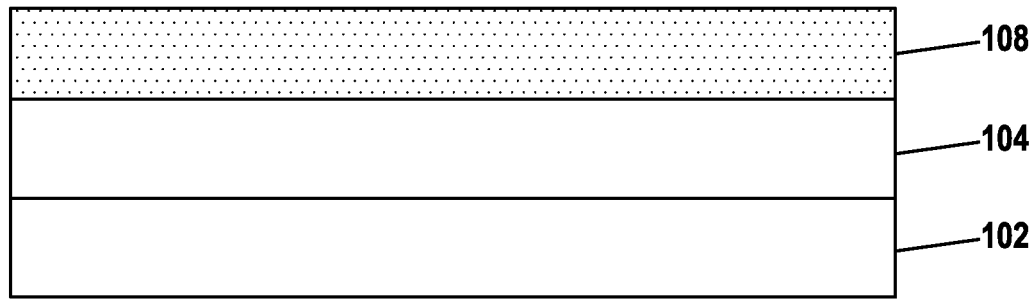

Next, as shown in FIG. 10B, the process includes anodizing some or all of the metal layer 106 to form a porous layer 108 above the conductive layer 104. The porous layer 108 has pores that extend perpendicularly from a top surface of the porous layer 108 toward the conductive layer 104. When the metal layer 106 is made of aluminum, the porous layer 108 is made of anodic aluminum oxide (AAO).

In FIG. 10B, it is illustrated that the metal layer 106 is anodized in its entirety. While this embodiment is possible, in practice a small portion of metal layer 106 may be left non-anodized at the edges of the die and/or in the dicing street.

Because of the proposed layout, a uniform anodization can be obtained across the wafer. As such, the porous layer 108 has well-formed pores, i.e., they are substantially uniform and extend all the way down, substantially perpendicularly, to the conductive layer 104. In practice, an extra etching step may be used to ensure that the pores are fully open onto the conductive layer 104.

Figure 10C:
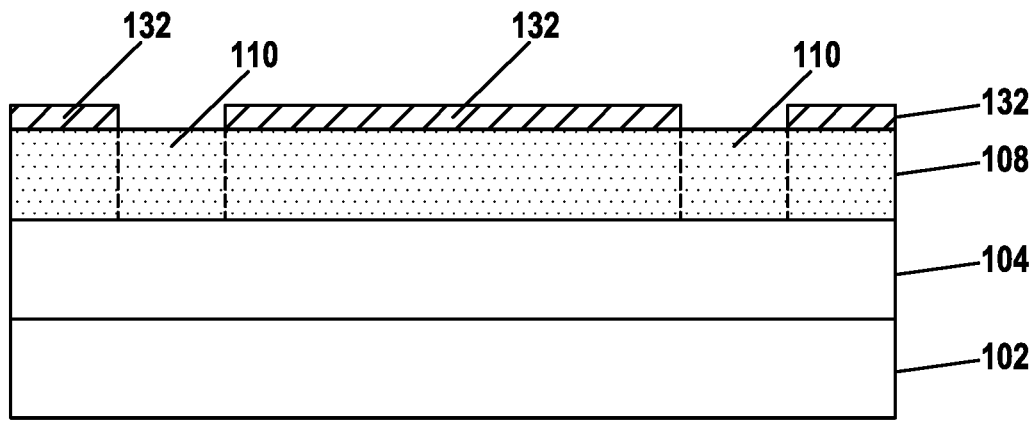

Next, as shown in FIG. 10C, a first hard mask layer 132 is applied over the porous layer 108. The first hard mask layer 132 is patterned to have openings over a defined first region 110 of the porous layer 108.

Preferably, the material for first hard mask layer 132 may be selected so as to be highly non-conformal to avoid that it enters into the pores of the porous layer 108.

Figure 10D:
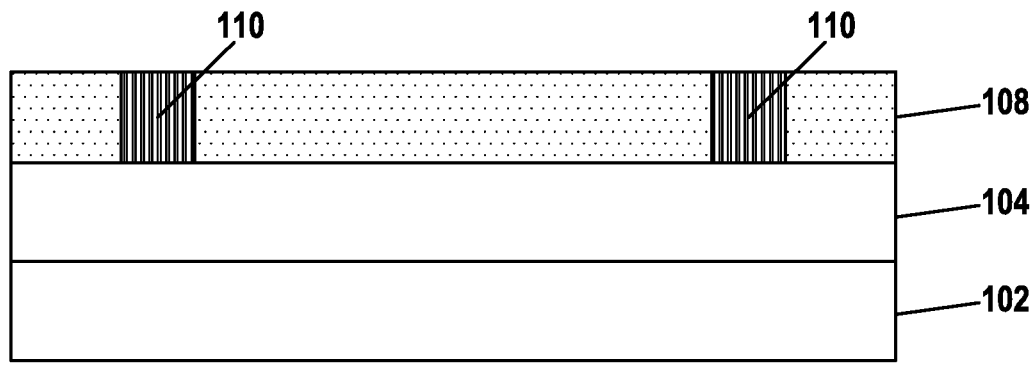

Subsequently, as shown in FIG. 10D, conductive wires are formed in the pores of the first region 110. In an embodiment, the conductive wires are grown by electrochemical deposition (ECD). The conductive wires may be made of nickel or copper, for example. In an embodiment, the bottom ends of the conductive wires contact the conductive layer 104 at the bottoms of the pores of the first region 110.

Figure 10E:
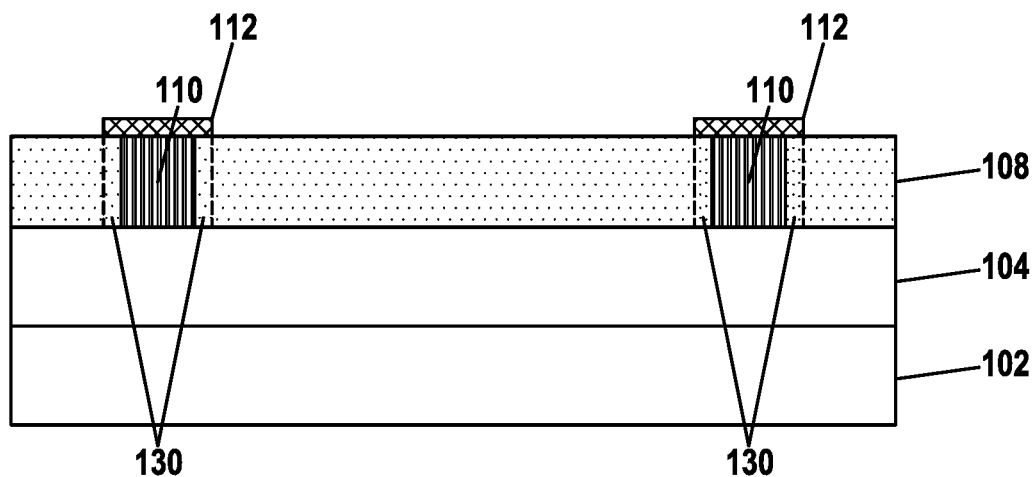

The first hard mask layer 132 is then removed, and a second hard mask layer 112 is applied and patterned as shown in FIG. 10E. Specifically, the second hard mask layer 110 is patterned so as to cover the first region 110 of the porous layer as well as an adjacent third region 130 of the porous region. As further described below, the third region 130 will serve as an isolation region according to this embodiment.

Next, as shown in FIG. 10F, a MIM structure is disposed into the pores of a second region 120 of the porous layer 108. According to this embodiment, the second region 120 corresponds to the region of the porous layer 108 that is not covered by the second hard mask 110, i.e., outside of the first region 110 and the third region 130.

In an embodiment, this includes depositing the MIM structure into the porous layer 108 and over the second hard mask 112. In an embodiment, the top metal layer of the MIM structure may be etched over the first region 110 and the third region 130 as shown in FIG. 10F.

The deposition of the MIM structure into the pores of the second region 120 is highly conformal. In an embodiment, the MIM structure comprises a first metal layer (114), disposed conformally into the second region (120), an insulator layer (116) disposed conformally over the first metal layer (114), and a second metal layer (118) disposed conformally over the insulator layer (116). In an embodiment, the first metal layer contacts the conductive layer 104 at the bottom of each pore of the second region 120.

Next, as shown in FIG. 10G, a first conductive layer 122 may be formed over the MIM structure. The first conductive layer 122 may be etched over the first region 110 and the third region 130 as shown in FIG. 10G. In an embodiment, the first conductive layer 122 may serve as a top electrode of the capacitor structure.

Figure 10H:
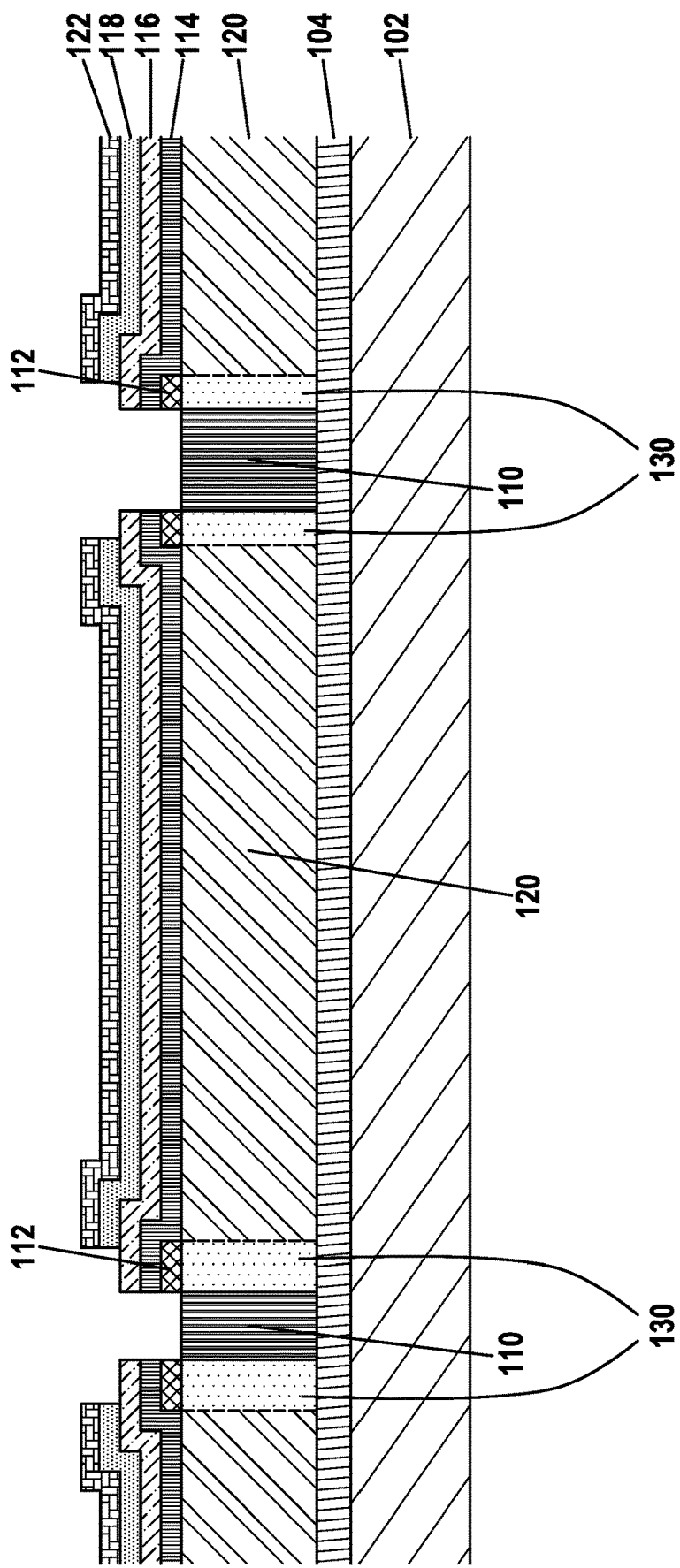

Subsequently, as shown in FIG. 10H, the MIM structure (the first metal layer 114 and the insulator 116) and the second hard mask 112 are etched over at least a section of the first region 110 of the porous layer. This exposes the top ends of at least some of the conductive wires built into the first region 110 of the porous layer.

Next, as shown in FIG. 10I, an insulation layer 124 is formed over the first conductive layer 122. The insulation layer 124 fully covers (encapsulates) the first conductive layer 122.

Figure 10J:
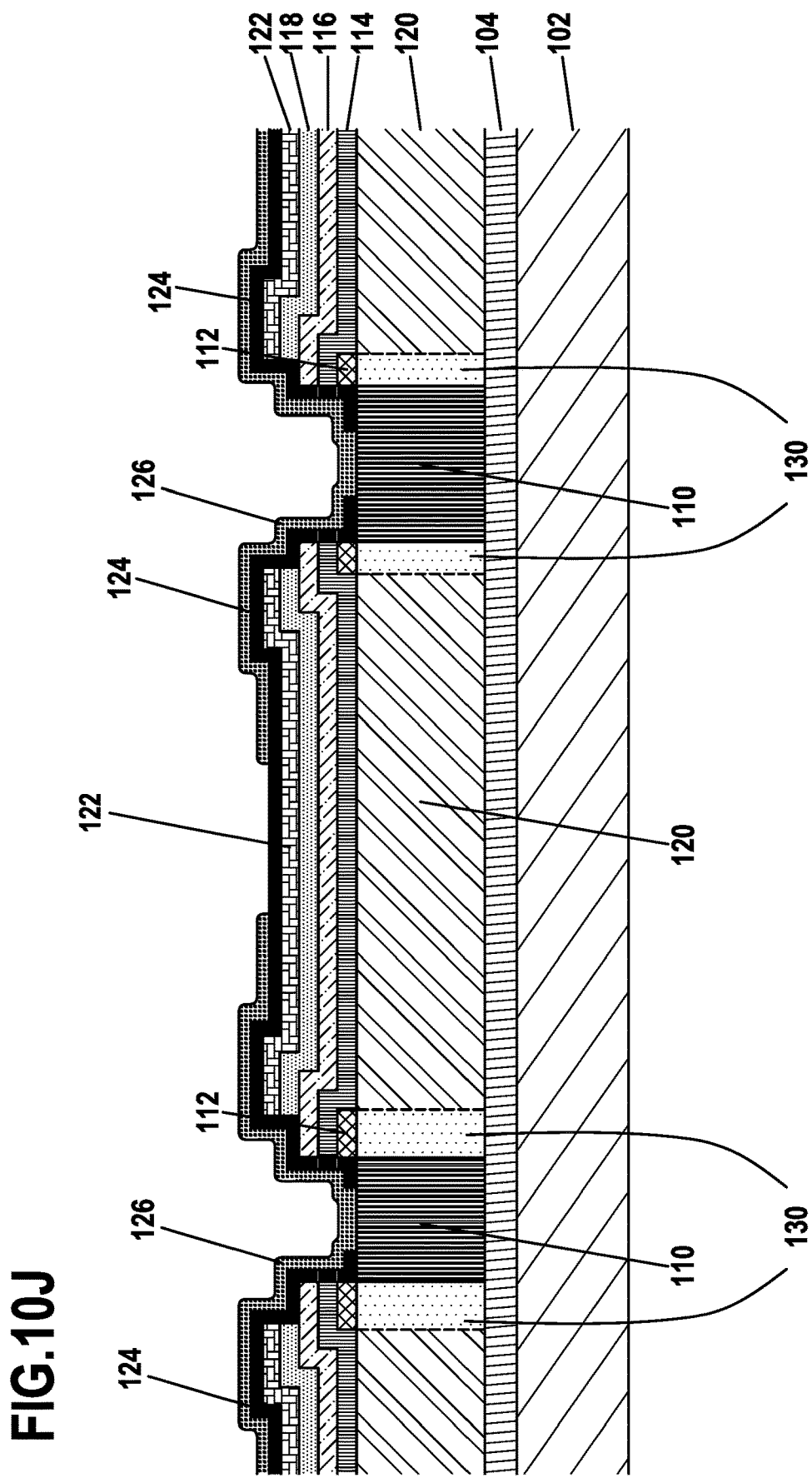

Then, as shown in FIG. 10J, a second conductive layer 126 is formed. The second conductive layer 126 covers the exposed section of the first region 110 and at least a portion of the insulation layer 124. The second conductive layer 126 is in contact with the exposed top ends of at least some of the conductive wires. In an embodiment, the second conductive layer may serve as a contact to the bottom electrode of the capacitor structure.

Figure 10K:
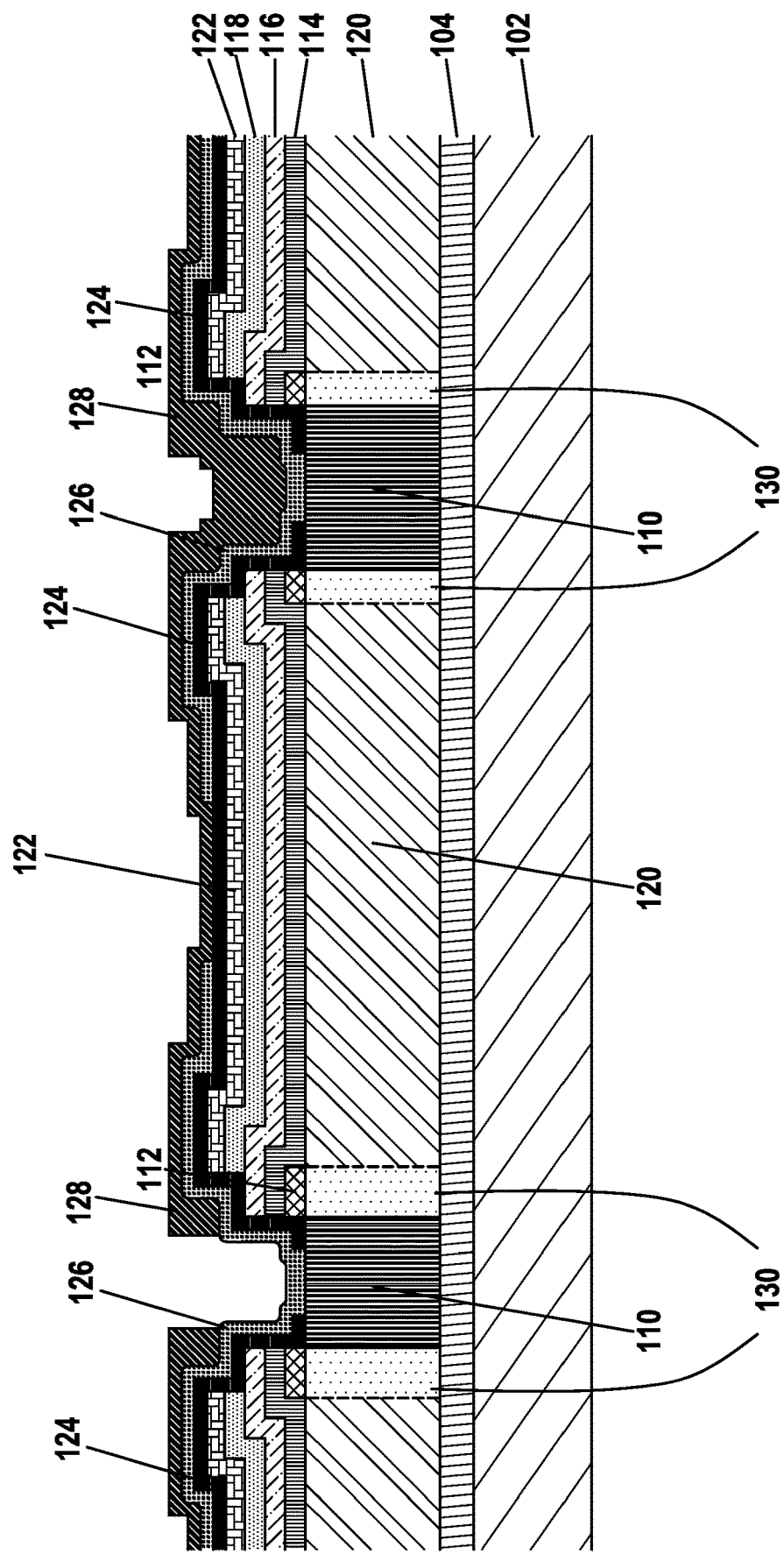

Finally, as shown in FIG. 10K, a passivation layer 128 may be formed over the structure.

Figure 11:
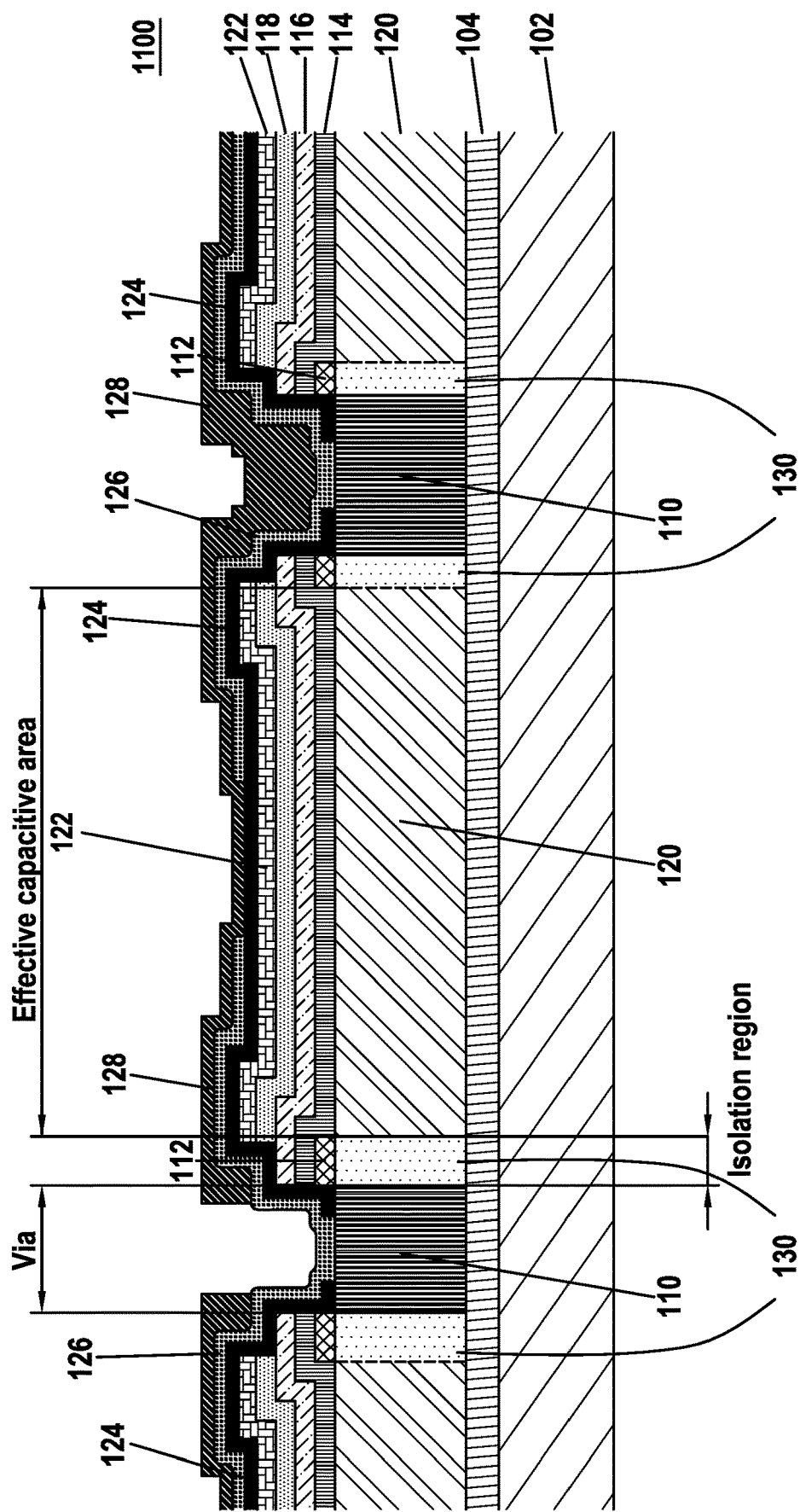
FIG. 11 illustrates an example capacitor structure according to an environment.

FIG. 11 illustrates an example capacitor structure 1100 according to an embodiment. Example structure 1100 is provided for the purpose of illustration and is not limiting of embodiments. Capacitor structure 1100 may be obtained using the process described above.

As shown, capacitor structure 1100 includes a porous layer that comprises a first region 110, a second region 120, and a third region 130.

In the first region 110, conductive wires are disposed in the pores of the porous layer, providing a vertical electrical via through the structure. The bottom ends of the conductive wires contact a conductive layer 104 at the bottom of the pores of the first region 110.

In the second region 120, a MIM structure is formed in the pores of the porous layer, providing a capacitor in the structure.

The third region 130 separates the first region 110 and the second region 120. In embodiment, the third region 130 isolates the first region 110 and the second region 120. In an embodiment, the pores of the third region 130 are empty.

In an embodiment, the conductive layer 104 comprises a first layer and a second layer, the second layer disposed between the first layer and the porous layer. In an embodiment, the second layer is discontinuous and open under the first region 110 and/or the second region 120 of the porous layer.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

The invention claimed is:

1. A capacitor structure, comprising:
   a substrate;
   a first conductive layer above the substrate; and
   a porous layer made of anodic aluminum oxide, above the first conductive layer, having pores that extend perpendicularly from a top surface of the porous layer toward the first conductive layer,
   wherein the porous layer comprises a first region in which pores conductive wires are disposed, the bottom ends of the conductive wires contacting the first conductive layer at the bottom of the pores of the first region and the top ends of the conductive wires contacting a second conductive layer on the top surface of the porous layer in the first region, whereby the conductive wires constitute a conductive via through the porous layer, the conductive via interconnecting the first and second conductive layers, and the porous layer comprises a second region in which pores of a metal-insulator-metal structure is disposed.

2. The capacitor structure of claim 1, wherein the porous layer comprises a third region having empty pores, the third region separating the first region and the second region.

3. The capacitor structure of claim 2, wherein the third region is immediately adjacent to the first region and immediately adjacent to the second region.

4. The capacitor structure of claim 1, wherein the metal-insulator-metal structure disposed in the pores of the second region comprises a first metal layer, disposed conformally into the second region, an insulator layer disposed conformally over the first metal layer, and a second metal layer disposed conformally over the insulator layer, and wherein the first metal layer contacts the conductive layer at the bottom of each pore of the second region.

5. The capacitor structure of claim 1, wherein the first conductive layer comprises a first layer and a second layer, the second layer disposed between the first layer and the porous layer.

6. The capacitor structure of claim 5, wherein the first layer is made of aluminum and the second layer is made of tungsten.

7. The capacitor structure of claim 5, wherein the second layer is discontinuous and open under the first region and/or the second region of the porous layer.

8. The capacitor structure of claim 1, further comprising: a metal layer, above the conductive layer, surrounding the porous layer from the sides.

9. The capacitor structure of claim 1, further comprising: an additional conductive layer in contact with the metal-insulator-metal structure;
   wherein the second conductive layer is isolated from the first conductive layer.

10. A method of fabricating a capacitor structure, the method comprising:
    forming a porous layer made of anodic aluminum oxide above a first conductive layer, the porous layer having pores that extend perpendicularly from a top surface of the porous layer toward the conductive layer;
    forming conductive wires in the pores of a first region of the porous layer, the bottom ends of the conductive wires contacting the first conductive layer at the bottoms of the pores of the first region, the conductive wires extending to the top of the porous layer;
    forming a second conductive layer on the top surface of the porous layer in the first region, the top ends of the conductive wires contacting the second conductive layer whereby the conductive wires comprise a conductive via through the porous layer, the conductive via interconnecting the first and second conductive layers; and forming a metal-insulator-metal structure in the pores of a second region of the porous layer.

11. The method of claim 10, wherein forming the conductive wires in the pores of the first region comprises:
depositing a first hard mask over the porous layer, the first hard mask being open over the first region; and
growing the conductive wires in the pores of the first region by electro-chemical deposition.

12. The method of claim 11, wherein forming the metal-insulator-metal structure in the pores of the second region comprises:
removing the first hard mask;
depositing a second hard mask covering the first region and an adjacent third region of the porous layer; and
depositing the metal-insulator-metal structure into the porous layer and over the second hard mask.

13. The method of claim 12, further comprising:
forming an additional first conductive layer over the metal-insulator-metal structure;
etching the metal-insulator-metal structure and the second hard mask over a section of the first region to expose the first region in the section;
forming an insulation layer over the additional conductive layer, the insulator layer fully covering the additional conductive layer; and
forming a second conductive layer over the exposed section of the first region and at least a portion of the insulation layer, the second conductive layer in contact with the top ends of the at least some of the conductive wires.

* * * * *